United States Patent [19]
Chandra et al.

[11] Patent Number: 5,206,862
[45] Date of Patent: Apr. 27, 1993

[54] METHOD AND APPARATUS FOR LOCALLY DERIVING TEST SIGNALS FROM PREVIOUS RESPONSE SIGNALS

[75] Inventors: Susheel J. Chandra, Fremont; Tushar Gheewala, Cupertino, both of Calif.

[73] Assignee: Crosscheck Technology, Inc., San Jose, Calif.

[21] Appl. No.: 667,611

[22] Filed: Mar. 8, 1991

[51] Int. Cl.5 .......................................... G01R 31/28
[52] U.S. Cl. ..................................... 371/27; 371/22.1
[58] Field of Search ........................ 371/22.1, 27, 15.1; 324/73.1, 158 R

[56] References Cited

U.S. PATENT DOCUMENTS

| 3,795,859 | 3/1974 | Benante et al. | 324/73 R |
| 3,806,891 | 4/1974 | Eichelberger et al. | 371/22.3 |
| 4,293,919 | 10/1981 | Dasgupta et al. | 371/22.3 |
| 4,513,418 | 4/1985 | Bardell, Jr. et al. | 371/22.3 |
| 4,517,672 | 5/1985 | Pfleiderer et al. | 371/27 |
| 4,613,970 | 9/1986 | Masuda et al. | 371/25.1 |
| 4,749,947 | 6/1988 | Gheewala | 324/73 R |
| 4,779,273 | 10/1988 | Beucler et al. | 371/27 |
| 4,791,356 | 12/1988 | Warren et al. | 371/27 |
| 4,903,267 | 2/1990 | Arai et al. | 371/27 |

FOREIGN PATENT DOCUMENTS 0223714  5/1987  European Pat. Off. .

OTHER PUBLICATIONS

"Design for Testability—A Survey", by T. W. Williams, et al., Proceedings IEEE, vol. 71, pp. 359-416, Jan., 1983.
"A Logic Design Structure for LSI Testability", Eichelberger, et al., Proceedings 14th Design Automation Conf., Jun., 1977.
"Built-in Self-Test Techniques" by E. J. McClusky, IEEE Design and Test, vol. 2, No. 2, pp. 21-28.
"Built-in Self-Test Structures" by E. J. McClusky, IEEE Design and Test, vol. 2, No. 2, pp. 29-36.
"Voltage Checking Device" by G. Canard and A. Potocki, IBM Technical Disclosure Bulletin, vol. 8, No. 5, Oct. 1965.

Primary Examiner—Charles E. Atkinson
Attorney, Agent, or Firm—Townsend and Townsend Khourie and Crew

[57] ABSTRACT

An IC has local test circuitry including a test point array, instruction register, data register, probe line drivers and control/sense line drivers/receivers. To test the IC, the instruction register is loaded initiating the test circuitry to address select test points to receive control signals and to address other select test points at which response signals are to be sensed. Control signals are produced from the data register contents. The data register contents are derived as a function of the prior contents of the data register and a bit pattern formed from response signals of select test points. According to one embodiment, the prior contents are exclusively or'ed with the bit pattern of response signals to derive the new data register contents. A continuous test is performed by using prior response signals exclusively OR'ed to data register contents so as to generate subsequent control signals. Predesigned test sequences enable fast continuous testing of the IC.

7 Claims, 2 Drawing Sheets

METHOD AND APPARATUS FOR LOCALLY DERIVING TEST SIGNALS FROM PREVIOUS RESPONSE SIGNALS

CROSS REFERENCE TO RELATED APPLICATIONS

This invention is related to commonly-assigned U.S. Pat. No. 4,749,947 issued Jun. 7, 1988 for GRID-BASED, "CROSS-CHECK" TEST STRUCTURE FOR TESTING INTEGRATED CIRCUITS; commonly-assigned U.S. patent application No. 554,313, filed Jul. 17, 1990, now U.S. Pat. No. 5,157,627 issued Oct. 20, 1992 for METHOD AND APPARATUS FOR SETTING DESIRED SIGNAL LEVEL ON STORAGE ELEMENT; commonly-assigned U.S. patent application No. 601,969 filed Oct. 23, 1990 for METHOD AND APPARATUS FOR SETTING DESIRED LOGIC STATE AT INTERNAL POINT OF A SELECT STORAGE ELEMENT and commonly-assigned U.S. patent application No. 482,458 filed Feb. 20, 1990, now U.S. Pat. No. 4,975,640 issued Dec. 4, 1990 for METHOD FOR OPERATING A LINEAR FEEDBACK SHIFT REGISTER AS A SHIFT REGISTER WITH A CROSSCHECK GRID STRUCTURE. The contents of such patent and patent applications are incorporated herein by reference in their entirety, and made a part hereof.

BACKGROUND OF THE INVENTION

This invention relates to an apparatus and method for deriving test signals for an integrated circuit ("IC") under test. More particularly, this invention relates to a method and apparatus for deriving test signals by signal compression of prior test responses.

To test an IC, test signals are applied to select test points, while responses are sensed. As ICs become more complex, more test points are needed to test internal circuit elements. As a result, complex ICs often are designed with internal test circuitry which accommodates extensive testing. Such internal test circuitry may include shift registers which receive test signal patterns to be shifted out of the register to various test points. Accordingly, one or more external pins are used for entering test signals to such shift registers for being relayed to multiple internal test points.

Such an approach is commonly referred to as SCAN. See "Design For testability—A Survey" by T.W. Williams and K.P. Parker, *Proceedings IEEE*, Vol 71, pp. 98–112, January 1983; and "A Logic Design Structure For LSI Testing" by E.B. Eichelberger and T.W. Williams, *Proceedings 14th Design Automation Conference*, June 1977 77CH1216-1C, pp. 462–468. Also see "Built-in Self-Test Techniques" and "Built-in Self-Test Structures" by E.J. McCluskey, *IEEE Design and Test*, Vol. 2, No. 2, pp. 437–452. Also see U.S. Pat. Nos. 3,806,891 (Eichelberger et. al.); 4,293,919 (Dasgupta et. al.) and 4,513,418 (Bardell, Jr. et. al.) assigned to the IBM Corporation which disclose the serial connection of flip-flops into a shift register to allow access to them through "fewer" test points.

According to the SCAN approach, the integrated circuit is designed to tie select storage elements (e.g., test points) to one or more shift register chains. The shift registers are loaded through test contacts or through the primary input pins during a test, enabling the desired logic states to be loaded to the select storage elements Thus, the test signals are generated off-chip and multiplexed to the appropriate test point.

According to built-in self test ("BIST) approaches a test pattern is stored in an on-chip ROM device or is generated as a pseudo-random pattern using an on-chip device. Such BIST approaches typically are used for on-line or off-line testing in which signals are not applied at the primary input pins once the test commences.

Other approaches for defining test signals and monitoring internal IC components are described in U.S. Pat. No. 4,613,970 for INTEGRATED CIRCUIT DEVICE AND METHOD OF DIAGNOSING THE SAME; EPO patent publication number 223 714 A2 for SEMICONDUCTOR INTEGRATED CIRCUIT DEVICE WITH TEST CIRCUIT; U.S. Pat. No. 4,517,672 for METHOD AND ARRANGEMENT FOR AN OPERATIONAL CHECK OF A PROGRAMMABLE LOGIC ARRAY; IBM Technical Disclosure Bulletin Vol. 8, no. 5 Oct. 1965, "Voltage Checking Device" by G. Canard and A. Potocki; and U.S. Pat. No. 3,795,859 for METHOD AND APPARATUS FOR DETERMINING THE ELECTRICAL CHARACTERISTICS OF A MEMORY CELL HAVING FIELD EFFECT TRANSISTORS.

SUMMARY OF THE INVENTION

According to the invention, test signals (e.g., control signals) to be applied to internal test points of an IC are derived from prior test point response signals sensed within the IC. According to one aspect of the invention, the sensed signals are compressed at a data register (e.g., signed compression) to form a bit pattern. A respective bit of such pattern is used to generate a test signal for a respective test point. According to one embodiment, signal compression is achieved by performing for select bits an exclusive OR operation on the sensed signals (e.g., response signals) and the data register contents resulting in new data register contents. The new contents along with appropriate signals applied at the primary inputs form the bit pattern used for generating one or more test signals.

According to another aspect of the invention, the data register contents are modified according to a prescribed function by one or more test point response signals. The new contents form the bit pattern used for generating one or more test signals. A test sequence is formed by deriving test signals (e.g., control signals) from prior response signals. At each test step, the data register contents are updated by exclusively OR'ing the response signals and the data register contents to derive new contents. Select bits of the new contents define corresponding control signals output to select test points. Select responses to those control signals are then exclusively OR'ed with the data register contents to define new contents, and so on. The test sequence is organized based upon expected responses. The actual responses, if the same as the expected responses, result in later test signals of desired logic states. As a result, a fast continuous test process is achieved for non-defective ICs.

DESCRIPTION OF THE PREFERRED EMBODIMENT

Overview

Typically, a test pattern for identifying a fault condition is a signal pattern applied at the primary input pins of an IC under test while the internal components of the IC are in a particular state. Common assigned U.S. patent application Ser. No. 554,313, now U.S. Pat. No. 5,157,627 issued Oct. 20, 1992, discloses a method for setting a particular state at internal circuit elements by loading the desired state into a data register serially from off-chip. The apparatus and method of this invention generate the state signal for the desired state on-chip.

Figure 1:
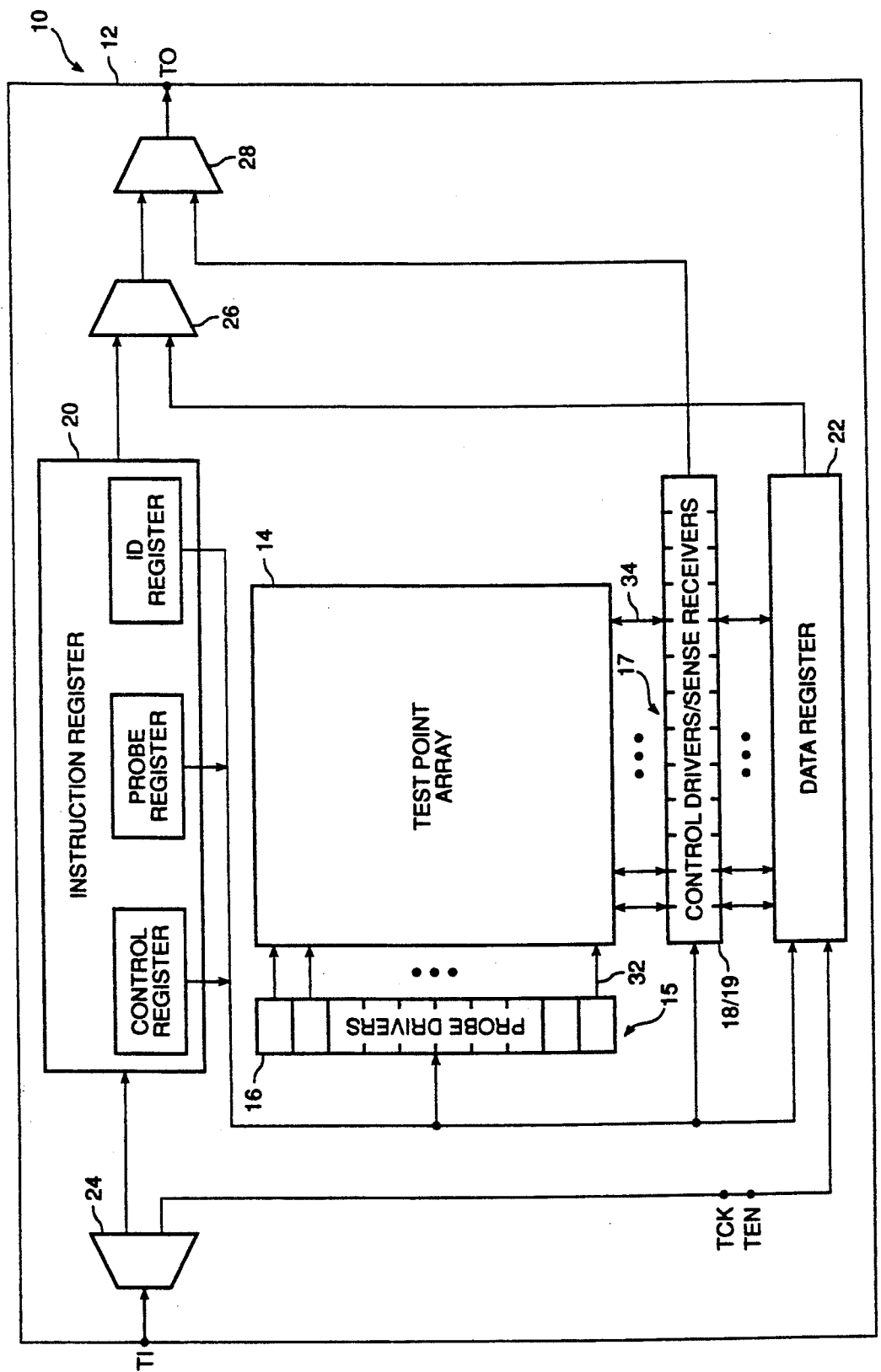
FIG. 1 is a block diagram of on-chip test circuitry according to an embodiment of this invention.

FIG. 1 shows local test circuitry 10 residing on an integrated circuit 12 to be tested. The test circuitry 10 includes a test point array 14, a plurality 15 of probe line drivers 16, a plurality 17 of control/sense line drivers/receivers 18, 19, an instruction register 20, a data register 22, a multiplexor 24, and demultiplexors 26, 28. The IC 12 includes external pin contacts for receiving a test clock signal TCK, a test enable signal TE, a test input signal TI and a test output signal TO. The function of the test circuitry 10 is to generate control signals (e.g., test signals) for select test points of the test point array 14, while monitoring resulting response signals.

The IC 12 also embodies operational (e.g., non-test) circuitry, such as microprocessor, memory or logic circuitry. A plurality of test points within such operational circuitry are provided. An element of the operational circuitry is coupled to a test point to enable testing of such element. During testing, the test point is sensed and/or exercised. The local test circuitry 10 interfaces to the test points to test the operational circuitry. The plurality of test points form the test point array 14. A test point may be coupled to an internal circuit element or a primary input pin.

Figure 2:
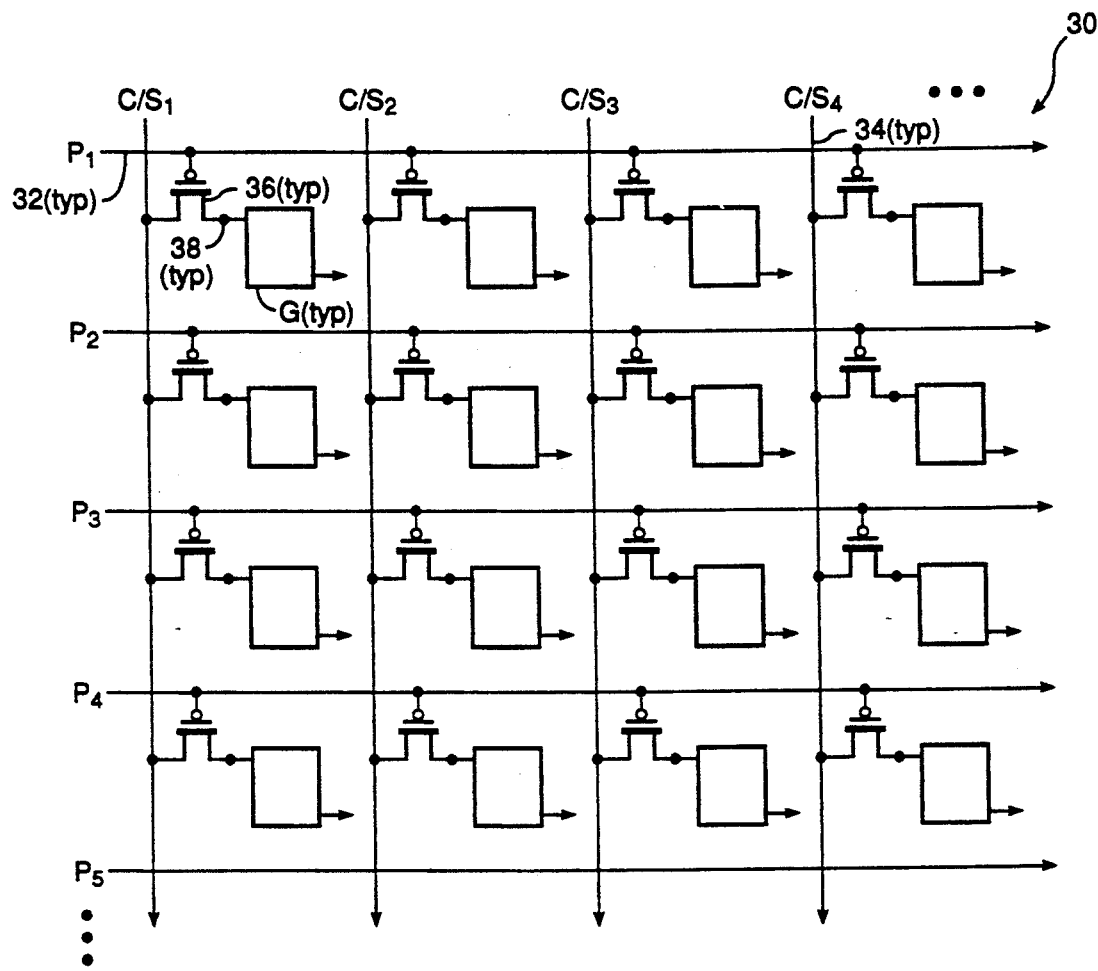
FIG. 2 is a schematic diagram of a prior art test point array having intersecting probe lines and control/sense lines coupled to electronic switches.
Figure 3:
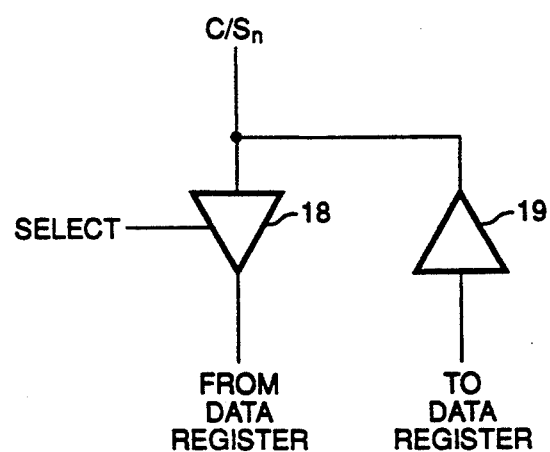
FIG. 3 is a logic diagram of a control driver and sense amplifier.

FIG. 2 shows a test grid structure 30 embodying the test point array 14. Such test grid structure 30 is described in the commonly-assigned U.S. Pat. No. 4,749,947 issued Jun. 7, 1988 for GRID-BASED, "CROSS-CHECK" TEST STRUCTURE FOR TESTING INTEGRATED CIRCUITS. The grid structure 30 is formed of individually accessible probe lines 32 and control/sense lines 34 with electronic switches 36 at the crossings. A probe line 32 is coupled to a switch 36 for defining the switch "ON" or "OFF" state. One conducting channel of the switch 36 is coupled to a test point 38, while another conducting channel is coupled to a control/sense line 34. Each control/sense line 34 is coupled to a sense receiver 19 and control driver 18 (see FIG. 3). When the sense driver 18 is inactive, the line 34 functions as a sense line for monitoring a response signal from the test point 38. When the driver 18 is active, the line 34 functions as a control line along which a control signal is conducted toward a test point 38. Activating a select switch 36 through a corresponding probe line 32 enables a test point 38 to be sensed or controlled.

Methods for controlling the test point signal level are described in commonly-ass U S. patent application No. 554,313 filed Jul. 17, 1990, now U.S. Pat. No. 5,157,627 issued Oct. 20, 1992, for METHOD AND APPARATUS FOR SETTING DESIRED SIGNAL LEVEL ON STORAGE ELEMENT and commonly-assigned U.S. patent application No. 601,969 filed Oct. 23, 1990 for METHOD AND APPARATUS FOR SETTING DESIRED LOGIC STATE AT INTERNAL POINT OF A SELECT STORAGE ELEMENT.

The IC 12 is tested by applying respective control signals to select test points 38 and sensing respective response signals from other select test points 38. To apply a control signal to a select test point 38, the instruction register 20 is loaded by external test electronics (not shown). The instruction register 20 in response activates a select probe line driver 16 and enables an appropriate control driver/sense receiver 18, 19 to function as a driver. The control signal then is read from a corresponding bit of the data register 22, and fed through the driver 18 and a switch 36 to the select test point 38.

To sense a response signal from a select test point 38, the instruction register 20 activates a select probe line driver 16 and sets an appropriate control driver/sense receiver 18, 19 to receiver. The response signal then is read from the select test point 38 through switch 36 into receiver 19 and data register 22 at a corresponding register bit.

The steps of driving a control signal and monitoring a response signal at different test points are accomplished with one or more instructions loaded into instruction register 20. A first instruction may activate a first probe line driver 16 and first control line driver 18, while a second instruction activates a second probe line driver 16 and second sense line receiver 19.

A response signal may be read at the IC test output signal TO by defining a path between a sense line receiver 19 and the output terminal TO. The path is formed by selecting demultiplexor 28 to channel the response signal from the sense line receivers 19. Alternatively, a path may be formed by selecting demultiplexor 26 to channel the data register 22 contents and selecting demultiplexor 28 to channel the signal from the demultiplexor 26. Signals (not shown) are input to demultiplexors 26, 28 from the instruction register 20 for selecting the channel which defines the output signal. Accordingly, the response signal of the addressed test point 38 appears at the terminal TO.

Local Derivation of Test Signals

The data register 22 is loaded with a bit pattern which defines the control signals to be applied to select test points 38. According to conventional practice, such bit pattern is loaded from external electronics (not shown). According to one aspect of the invention, however, the bit pattern is derived locally from prior response signals read from select test points 38.

To derive the bit pattern forming the data register 22 contents at a given time, the component data register bits are either loaded with available response signal levels or derived by performing a function on the current bit content and a parallel bit input from a sense line 34. Prior to testing of a batch of ICs, probe lines of a simulated error-free IC are scanned to identify sense lines 34 which will provide a desired logic level for a corresponding bit of the data register 22. If a sense line 34 having the desired logic level is present, then the data register is to be loaded with the logic level of such sense line 34. If a sense line 34 does not have the desired logic level, then a function is to be performed on the corresponding data register bit with a parallel bit input from the control line 34 to achieve the desired logic level.

Thus during testing of an IC, the desired bit pattern is derived at the data register 22 by loading specific bits with selected sense line 34 response signals. In addition, a function is performed on the register contents at the other bits with and one or more parallel bit inputs (e.g., sense line response signals) to achieve the desired contents at the remaining bits. The resulting bit pattern forms the new register 22 contents used for producing the control signals. According to the preferred embodiment, the data register 22 is a linear feedback shift register which is programmed to "exclusively OR" the current register contents with parallel data input from one or more sense line receivers 18 to form the new contents. Each register bit is derived by performing an exclusive "or" operation on the register bit and the sense signal input coupled to such register bit. A preferred embodiment of the data register 22 and logic circuitry for altering the contents of such register is described in commonly-assigned U.S. patent application No. 482,458 for METHOD FOR OPERATING A LINEAR FEEDBACK SHIFT REGISTER AS A SERIAL SHIFT REGISTER WITH A CROSS-CHECK GRID STRUCTURE, incorporated herein in its entirety by reference.

Test Sequences

To test an IC 12, a test sequence is designed for exercising various operational circuit elements G (see FIG. 2). Response signals from one or more elements G are used with the data register contents to derive the control signals for exercising other elements G. Accordingly, the controls signals are derived from a signal compression of prior response signals.

Conclusion

Although a preferred embodiment of the invention has been illustrated and described, the invention may include alternative embodiments and changes. According to each embodiment, the current data register contents and select response signal parallel inputs are processed according to a prescribed function to derive the new data register contents. Although the embodiment described implements an exclusive "or" function, alternative functions may be implemented instead. Accordingly, the scope of the invention is not intended to be limited, except by the claims.

What is claimed is:

1. A method for defining a test signal for an IC test point based upon a logic state of a signal path local to the IC, the IC having an integral test structure comprising a plurality of probe lines, a plurality of control/sense lines and a data register, said data register for storing a first data pattern, the method comprising the steps of:

reading a first plurality of control/sense lines, each one of said first plurality of control/sense line defining a logic state;

deriving a second data pattern from said first data pattern and said first plurality of control/sense lines, said second data pattern being stored in said data register;

applying a plurality of bits of said second data pattern to a plurality of select test points, respectively.

2. The method of claim 1 further comprising, prior to said step of reading, the step of selecting said first plurality of control/sense lines; and prior to said step of applying, selecting a plurality of test points.

3. The method of claim 2 in which said step of selecting is performed by addressing corresponding probe lines.

4. The method of claim 1 in which said steps of reading and deriving comprise performing an exclusive "or" operation of said first data pattern and said first plurality of control/sense lines to derive said second data pattern.

5. The method of claim 1 in which said step of deriving includes complementing the logic state read from one of said first plurality of control/sense lines, and said step of applying includes writing back said complemented signal on said one of said first plurality so that a logic state toggle operation is achieved.

6. A method for defining a test signal for an IC test point based upon a logic state of a signal path local to the IC, the IC having an integral test structure comprising a plurality of probe lines, a plurality of control/sense lines and a data register, said data register for storing a first data pattern, the method comprising the steps of:

selecting a first control/sense line having a prescribed logic state and a plurality of second control/sense lines having a different logic state;

reading said first control/sense line and said plurality of second control/sense lines into said data register;

deriving a second data pattern from the data register contents by shifting said contents in said data register;

applying a plurality of bits of said second data pattern to a plurality of select test points, respectively; and repeating said steps of deriving and applying.

7. An apparatus for defining a test signal for an IC test point based upon a logic state of a signal path local to the IC, the IC having an integral test structure comprising a plurality of probe lines, a plurality of control/sense lines and a data register, said data register for storing a first data pattern, the apparatus comprising:

means for reading a first plurality of control/sense lines, each one of said first plurality of control/sense lines defining a logic state;

means for deriving a second data pattern from said first data pattern and said first plurality of control/sense lines, said second data pattern being stored in said data register;

means for selecting a plurality of bits of said second data pattern which define respective control signals to be applied to select test points.

* * * * *